United States Patent [19]
Johnson

[11] Patent Number: 5,861,721
[45] Date of Patent: Jan. 19, 1999

[54] SMOOTH SWITCHING MODULE

[75] Inventor: Samuel A. Johnson, Eagle, Id.

[73] Assignee: Beacon Light Products, Inc., Meridian, Id.

[21] Appl. No.: 753,420

[22] Filed: Nov. 25, 1996

[51] Int. Cl.$^6$ ..................................................... G05F 1/00
[52] U.S. Cl. ........................ 315/291; 315/307; 315/360; 315/362; 315/DIG. 4; 315/DIG. 7
[58] Field of Search .................................... 315/291, 307, 315/360, 362, 289, 224, 103, 209 R, DIG. 4, DIG. 5, DIG. 7; 307/135, 139–141.4; 323/235, 239

[56] References Cited

U.S. PATENT DOCUMENTS

| | | | |
|---|---|---|---|
| Re. 31,848 | 3/1985 | Nilssen | 315/360 |
| 3,265,930 | 8/1966 | Powell, Jr. | 315/209 |
| 3,422,309 | 1/1969 | Spira et al. | 315/194 |
| 3,641,403 | 2/1972 | Nakata | 317/235 |
| 3,684,919 | 8/1972 | Cramer | 315/194 |
| 3,697,821 | 10/1972 | Johnson | 317/148 |
| 3,707,648 | 12/1972 | Rosa | 315/231 |
| 3,808,456 | 4/1974 | Kay et al. | 307/140 |
| 3,818,263 | 6/1974 | Belko | 315/32 |
| 3,823,339 | 7/1974 | Borneman et al. | 315/69 |
| 3,851,209 | 11/1974 | Murakami et al. | 315/99 |
| 3,919,590 | 11/1975 | Remery et al. | 315/101 |
| 3,925,705 | 12/1975 | Elms et al. | 315/246 |
| 3,927,345 | 12/1975 | Licata et al. | 315/DIG. 5 |
| 3,935,505 | 1/1976 | Spiteri | 315/194 |
| 3,939,361 | 2/1976 | Aidala et al. | 307/141 |
| 3,942,070 | 3/1976 | Tomura et al. | 315/101 |
| 3,952,242 | 4/1976 | Ukai | 323/21 |
| 4,011,482 | 3/1977 | Seib | 315/361 |

(List continued on next page.)

FOREIGN PATENT DOCUMENTS

| | | |
|---|---|---|
| 0674390 | 9/1995 | European Pat. Off. . |
| 2508348 | 11/1975 | Germany . |
| 211028 | 6/1984 | Germany . |
| 5335558 | 12/1993 | Japan . |
| 1275749 | 5/1972 | United Kingdom . |

OTHER PUBLICATIONS

Starlight TN22 Preliminary Data Sheet, *SGS–Thompson Microelectronics;* Nov. 1991; pp. 1/5–5/5.

Manual; National Standard of Canada, "Limits and Methods of Measurement of Electromagnetic Disturbance Characteristics of Industrial, Scientific and Medical (ISM) Radio–Frequency Equipment" Dec. 1991; pp. 4–5.

Manual; International Electrotechnical Commission, Fourth Edition; "LImits and Method of Measurement of Radio Disturbance Characteristics of Electrical Lighting and Similar Equipment"; 1992; pp. 7–9, 15, 17, 19.

Manual; International Electrotechnical Commission, Third Edition; "Limita and Methods of Measurement of Radio Disturbance Characteristics of Electrical Motor–Operated and Thermal Appliances for Household and Similar Purposes, Electrical Tools and Electrical Apparatus"; 1993; pp. 19 and 98.

*Primary Examiner*—Robert J. Pascal
*Assistant Examiner*—Haissa Philogene
*Attorney, Agent, or Firm*—John R. Ley

[57] ABSTRACT

A switching module having a switching circuit which achieves a relatively smooth turn-on conduction transition characteristic and a relatively low power consumption. A controlled transition circuit conducts current to between two of its three terminals when in a fully conductive state. The transition circuit transitions from a non-conductive state to the fully conductive state over a predetermined amount of time to limit the di/dt and the interference signals generated by the di/dt. A low forward voltage conduction circuit also conducts current to the load in a conductive state and diverts current to the transition circuit when in a non-conductive state. The conduction circuit creates a second predetermined voltage across the terminals when in the conductive state which is substantially less than the first predetermined voltage to reduce the power consumption.

18 Claims, 3 Drawing Sheets

U.S. PATENT DOCUMENTS

| | | | |
|---|---|---|---|
| 4,087,723 | 5/1978 | Chermin et al. | 315/207 |
| 4,090,107 | 5/1978 | Seib | 315/156 |
| 4,099,099 | 7/1978 | Grüdelbach | 315/194 |
| 4,107,579 | 8/1978 | Bodine, Jr. et al. | 315/205 |
| 4,118,654 | 10/1978 | Ohta et al. | 40/361 |
| 4,119,887 | 10/1978 | Iyama et al. | 315/101 |
| 4,155,015 | 5/1979 | Nakasone et al. | 307/252 |
| 4,165,475 | 8/1979 | Pegg et al. | 315/99 |
| 4,181,872 | 1/1980 | Chermin | 315/106 |
| 4,204,149 | 5/1980 | Cleary et al. | 323/24 |
| 4,259,619 | 3/1981 | Wall | 315/361 |
| 4,276,486 | 6/1981 | Ahuja et al. | 307/252 |
| 4,276,542 | 6/1981 | Russ | 340/326 |
| 4,322,632 | 3/1982 | Hart et al. | 307/41 |
| 4,329,627 | 5/1982 | Holmes | 315/209 |
| 4,350,935 | 9/1982 | Spira et al. | 315/291 |
| 4,355,264 | 10/1982 | Merli | 315/289 |
| 4,447,759 | 5/1984 | Moerkens et al. | 315/60 |
| 4,504,778 | 3/1985 | Evans | 323/323 |
| 4,507,569 | 3/1985 | Hess, II | 307/130 |
| 4,527,099 | 7/1985 | Capewell et al. | 315/291 |
| 4,591,765 | 5/1986 | Beck | 315/361 |
| 4,613,790 | 9/1986 | Roorda | 315/72 |
| 4,628,230 | 12/1986 | Krokaugger | 315/307 |
| 4,634,957 | 1/1987 | Hollaway | 323/242 |
| 4,644,226 | 2/1987 | Vernooij et al. | 315/50 |
| 4,649,323 | 3/1987 | Pearlman et al. | 315/307 |
| 4,651,060 | 3/1987 | Clark | 315/199 |
| 4,668,877 | 5/1987 | Kunen | 307/116 |
| 4,673,844 | 6/1987 | Maytum et al. | 315/200 |
| 4,695,739 | 9/1987 | Pierce | 307/141 |
| 4,733,138 | 3/1988 | Pearlman et al. | 315/307 |
| 4,745,311 | 5/1988 | Iwasaki | 307/632 |
| 4,804,916 | 2/1989 | Frank | 323/300 |
| 4,870,340 | 9/1989 | Kral | 323/235 |
| 4,899,088 | 2/1990 | Black, Jr. et al. | 315/291 |
| 4,928,055 | 5/1990 | Kaieda et al. | 323/300 |
| 4,988,921 | 1/1991 | Ratner et al. | 315/159 |
| 5,004,960 | 4/1991 | Cockram et al. | 315/307 |
| 5,010,274 | 4/1991 | Phillips et al. | 315/101 |
| 5,030,890 | 7/1991 | Johnson | 315/208 |
| 5,055,746 | 10/1991 | Hu et al. | 315/291 |
| 5,111,115 | 5/1992 | Ball et al. | 315/239 |
| 5,126,634 | 6/1992 | Johnson | 315/71 |
| 5,214,354 | 5/1993 | Johnson | 315/71 |
| 5,221,877 | 6/1993 | Falk | 315/291 |
| 5,264,761 | 11/1993 | Johnson | 315/291 |
| 5,268,631 | 12/1993 | Gorman et al. | 323/246 |
| 5,319,285 | 6/1994 | Wang et al. | 315/289 |
| 5,321,338 | 6/1994 | Nuckolls et al. | 315/290 |
| 5,504,394 | 4/1996 | Johnson | 315/71 |
| 5,504,395 | 4/1996 | Johnson et al. | 315/71 |
| 5,504,398 | 4/1996 | Rothenbuhler | 315/209 R |
| 5,537,010 | 7/1996 | Johnson et al. | 315/289 |
| 5,631,523 | 5/1997 | Rothenbuhler et al. | 315/307 |

SMOOTH SWITCHING MODULE

This invention relates to a new and improved switching circuit which exhibits a smooth switching transition to significantly reduce radiated and conductive interference signals and which consumes a minimal amount of power to reduce heating. More particularly, the present invention relates to a smooth-transitioning, power-efficient, low interference switching circuit which is adapted to replace a conventional thyristor.

CROSS REFERENCE TO RELATED APPLICATIONS

This invention is related to the invention described in a concurrently filed U.S. patent application for a Smooth Switching Power Control Circuit and Method, Ser. No. 08/753,418 and is hereby incorporated in this application by this reference.

BACKGROUND OF THE INVENTION

Many types of electrical and electronic devices generate radiated and conductive interference signals. Radiated interference signals are typically broadcast through space. Conductive interference signals are typically conducted over power supply mains or power conductors. Radiated interference signals, if substantial enough in magnitude, may pose a health hazard. More typically however, conductive interference signals may adversely interfere with the proper operation of other electronic circuits which are located in close proximity and connected to the power supply mains. For these and other reasons, electronic devices are subject to governmental and regulatory restrictions limiting the amount of interference which can be emitted from such products. CISPR reports detail many of the specifics found in these regulations. The acronym "CISPR" refers to the Comité International Spécial des Perturbations Radioélectriques, also known as the International Special Committee on Radio Interference. The CISPR is the international committee that promotes unification by recommending approved standards to National Committees for adoption. Typically, the National Committees adopt the CISPR recommendations as their national rules in so far as national conditions will permit. Thus, regulations that set limits for interference characteristics of electrical lighting and similar equipment may be found in the CISPR reports.

Electrical switches are major sources of conductive interference in electrical control systems. Typical electrical switches include silicon controlled rectifiers (SCRs), thyristors and triacs, all of which are hereinafter generically referred to as thyristors. Generally, thyristors are three-terminal, gate-controlled, bistable AC switching devices that are incorporated in many electrical control applications. The thyristor switches the applied current on and off to regulate the delivered output power. In an AC environment, the electrical switch may switch the applied current on and off during each half cycle of AC power to regulate the power delivered to the load and therefore the output of the load. For example, the electrical control system may be a dimmer circuit which uses a thyristor to control the intensity of a light. An example of a thyristor-based dimmer circuit is described in U.S. Pat. No. Re. 35,220 which is assigned to the assignee hereof.

A thyristor generates interference signals as a result of an essentially instantaneous and virtually discontinuous current transition when switching from an off or non-conductive condition to an on or conductive condition, when a significant voltage exists across the thyristor at the time that the switching occurs. The instantaneous and discontinuous current transition is an inherent result of the switching action of the thyristor. The magnitude of the interference signal depends directly upon the magnitude of the current change rate with respect to time (di/dt). A relatively low di/dt value associated with the transition creates relatively low levels of interference. By comparison, larger di/dt values produce larger levels of interference signals.

Attempts to control the interference signals generated by thyristor-based circuits have involved the addition of auxiliary attenuating circuit elements. The attenuating circuit elements have taken the form of filters which may be as simple as a capacitor or inductor, or as complex as an elaborate multi-pole, multi-component, complex filter using both passive and active elements. U.S. Pat. Nos. 5,264,761; 5,504,394 and 5,504,395, all assigned to the assignee hereof, describe examples of such filtering and attenuation devices used with a thyristor. These auxiliary attenuating elements add to the complexity and the manufacturing expense associated with the products in which the thyristors are employed.

The other known method of reducing interference involves replacing the thyristor with a transistor-based switching circuit which provides a slower and smoother switching transition. The transistor-based switching circuit can be slowly turned on since the conduction characteristics of a power control transistor are controlled by a bias signal applied to the transistor. Slowly increasing the bias signal using simple circuit elements causes the transistor to slowly switch into full conduction. Moreover, during the transition period, current is conducted through the transistor in an amount that is proportional to the bias signal. Thus, the current change rate with respect to time (di/dt) through the transistor can be lowered based upon the simple circuit elements used to produce a gradual change in the bias signal. Since the magnitude of the interference signals is directly related to the magnitude of the di/dt, decreasing the di/dt reduces the magnitude of any generated interference signals. Typically, because of the lower di/dt, the transistor-based switching circuit avoids generating significant interference signals and is thus capable of complying with the pertinent regulations.

Although the transistor-based circuits provide the desirable slow turn-on characteristics and thus attenuate interference generation, they consume relatively high amounts of power. Usually the power consumption of a fully conductive transistor-based circuit is much higher than that of a thyristor. The forward conduction voltage of the power transistor and the forward bias voltages of the additional circuit elements result in significant power consumption. For example, since the power transistors are direct current devices, the power transistor requires a diode bridge to rectify the AC current. Since the power consumption for the circuit directly relates to the sum of the voltages across all circuit elements, the additional diode bridge voltages substantially increase the overall circuit power consumption.

The increased power consumption translates into more heat generated by the transistor-based switching circuit. Since high levels of heat will destroy the semiconductor elements, heat sinks are usually required to dissipate the heat. Heat sinks are relatively large and the addition of heat sinks to the circuit increases its overall size. The resulting size may be too large to integrate such a transistor-based switching circuit into small spaces such as lamp sockets and lamp bases. Furthermore, the useful longevity of the semiconductor elements is decreased in a high-heat environment.

The thyristor-based circuits, on the other hand, do not consume large amounts of power nor do they generate significant amounts of heat. No rectification diodes are necessary. Therefore, when in conduction, the thyristor is the primary circuit element conducting current and consuming power, and the power consumed by the circuit is dependent primarily on the forward voltage characteristics of the thyristor. The typical power consumption is substantially less than the typical power consumption of a transistor-based switching circuit. Unfortunately, however, the large di/dt values and unacceptable interference problems associated with known thyristor-based switching circuits may restrict the use of thyristors, despite low power consumption.

It is with respect to these and other factors that the present invention has evolved.

SUMMARY OF THE INVENTION

One aspect of the present invention relates to a switching circuit module having a switching circuit that uses a thyristor as its primary current conduction element and which exhibits a slow, relatively smooth switching transition from a non-conductive state to a conductive state. Another aspect of the present invention relates to a switching circuit that exhibits a slow, relatively smooth switching characteristic to avoid the generation of interference signals while exhibiting low power consumption. Moreover, another aspect of the invention relates to a switching circuit that provides slow, smooth switching transitions, consumes relatively low amounts of power and remains substantially small in size. A further aspect of the invention relates to a thyristor-replacement module, incorporated in a standard electrical device package, the module having the low-power consumption characteristics of a thyristor and the smooth switching characteristics of a power transistor.

In accordance with these and other aspects, a switching circuit module having a switching circuit of the present invention achieves a relatively smooth turn-on conduction transition characteristic and a relatively low forward voltage drop and power consumption. The switching circuit includes at least three terminals: a gate terminal, an anode terminal and a cathode terminal. Current is conducted between the anode and cathode terminals when the switching circuit is in conduction. A controlled transition circuit is electrically connected to conduct current between the anode and cathode terminals when in a fully conductive state and not to conduct current between the anode and cathode terminals when in a non-conductive state. The transition circuit transitions from the non-conductive state to the fully conductive state over a first predetermined amount of time when a predetermined voltage is applied to the gate terminal. Also, the transition circuit creates a first predetermined voltage across the terminals when in the fully conductive state. A low forward voltage conduction circuit is also electrically connected to conduct current between the anode and cathode terminals when in a conductive state and to divert current to the controlled transition circuit when in a non-conductive state. The conduction circuit creates a second predetermined voltage across the anode and cathode terminals when in the conductive state which is substantially less than the first predetermined voltage.

In accordance with its preferred aspects, the switching circuit module further includes a delay circuit which operatively initiates a transition from the non-conductive state to the conductive state of the low-forward voltage conduction circuit after the expiration of the first predetermined amount of time. The delay circuit also operatively limits the conduction circuit from conducting current between the anode and cathode terminals until after the transition circuit enters the conductive state. A power transistor and a biasing circuit are a part of the transition circuit. The biasing circuit supplies an increasing bias signal to the transistor over the duration of the first predetermined amount of time. The biasing circuit is initiated from a signal on the gate terminal. A thyristor is a part of the conduction circuit and a trigger signal delivery circuit triggers the thyristor into conduction after at the expiration of the first predetermined period of time.

In accordance with another one of its major aspects, the trigger signal delivery circuit of the conduction circuit further includes a trigger signal developing device connected to develop a trigger signal in response to the conduction of current by the transition circuit. The trigger signal developing device comprises an electrical device having a voltage-current characteristic which develops a voltage sufficient to trigger the thyristor upon conducting a predetermined amount of current delivered from the transition circuit after the transition circuit enters the conductive state. The trigger signal developing device may comprise a second thyristor in addition to the thyristor first aforesaid. Also, the trigger signal developing device may comprise a plurality of diodes connected in an anti-parallel relationship or opposing Zener diodes.

In accordance with another of its major aspects, the trigger signal developing circuit further includes a delay circuit and the voltage developed by the trigger signal developing device is applied to the delay circuit prior to triggering the thyristor into conduction. The trigger signal developing device comprises an electrical device having an electrical characteristic which develops a trigger signal as a result of the transition circuit conducting current upon entering the conductive state. The trigger signal developed by the electrical device is applied to the delay circuit to delay triggering the thyristor into conduction.

In accordance with another aspect of the present invention, the conduction circuit further comprises a current change rate attenuating device connected to the thyristor to limit the change of current per change in time conducted by the thyristor. Further, the current change rate attenuating device may be an inductor.

A more complete appreciation of the present invention and its scope may be obtained from the accompanying drawings, which are briefly summarized below, from the following detailed description of a presently preferred embodiment of the invention, and from the appended claims which define the scope of this invention.

DETAILED DESCRIPTION

Figure 1:
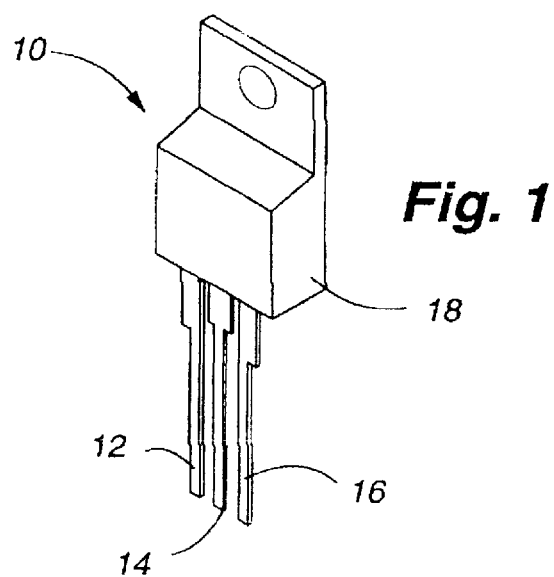
FIG. 1 is a perspective view of a smooth switching circuit module incorporating the present invention.

A switching module 10 which incorporates the present invention is shown in FIG. 1. The module 10 represents one example of a packaged electrical switching device that is interchangeable with existing thyristors in many existing electrical circuit designs. Similar to existing thyristors, the switching module 10 is a three-terminal, bistable, gate-controlled AC switching device.

As shown in FIG. 1 the switching module 10 comprises three terminals: an anode terminal 12, a cathode terminal 14 and a gate terminal 16. When the voltage on the gate terminal 16 is below a positive trigger level or above a negative trigger level, no current is conducted between the anode terminal 12 and the cathode terminal 14. This state is called the off or non-conductive state. On the other hand, the on or conductive state occurs when the voltage applied to the gate terminal 16 is at or exceeds the positive trigger level or is at or below the negative trigger level and current is conducted between the anode terminal 12 and the cathode terminal 14 causing the switching module 10 to latch and remain conductive even after the trigger signal applied to the gate terminal 16 is removed. The conduction terminates when the voltage across the terminals 12 and 14 is reversed or reduced to zero. Thus, the module 10 can be switched on in the same manner as existing thyristors. Although the conduction state characteristics appear similar to existing thyristors, the actual operation of the module 10 in transitioning from the non-conductive state to the conductive state is slower and smoother than existing thyristors. The slower and smoother transition duplicates a transistor-based circuit switching characteristic in the sense of reducing interference signals.

Figure 2:
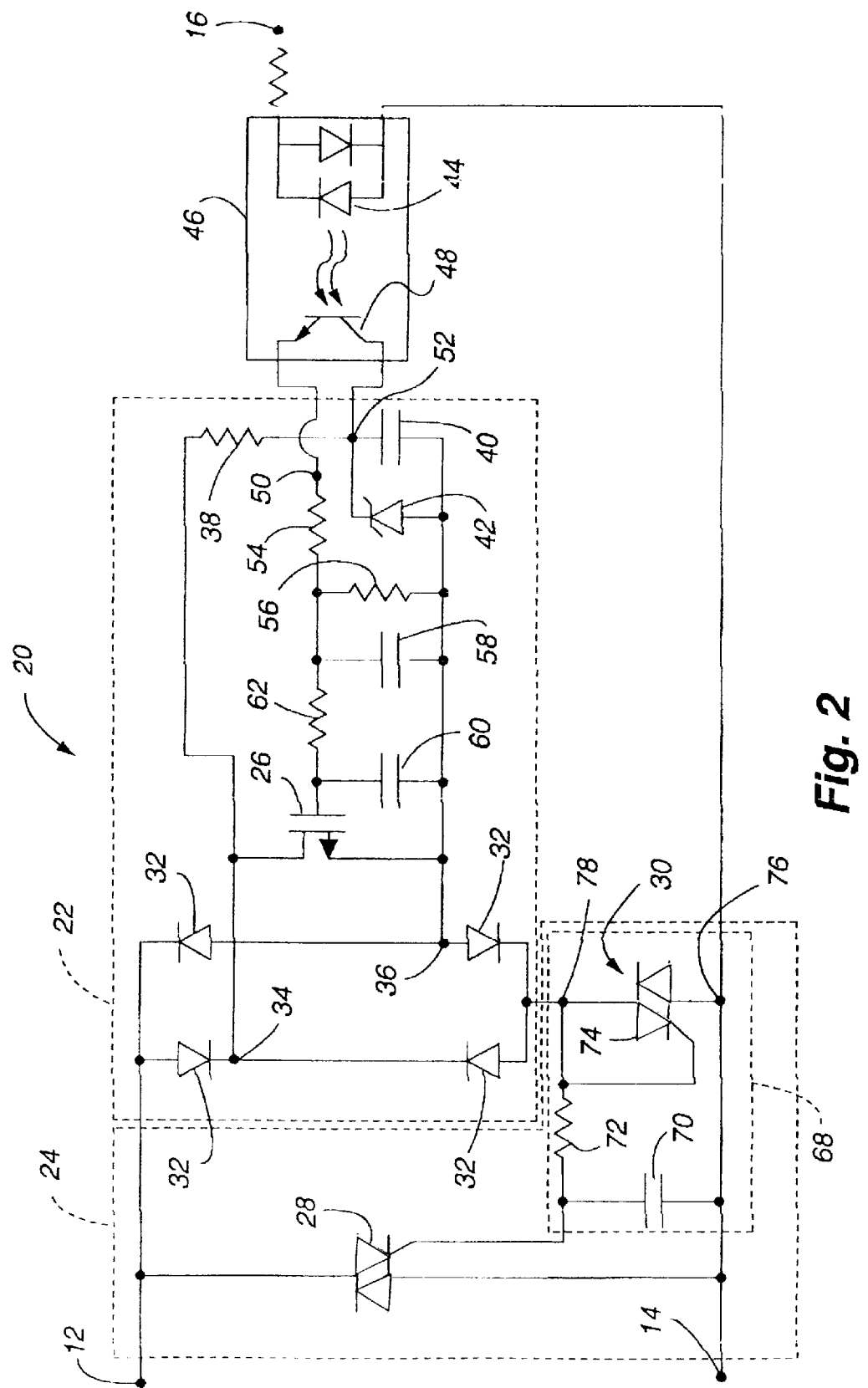
FIG. 2 is a schematic circuit diagram of a preferred embodiment of a switching circuit encased in the module shown in FIG. 1.

The module 10 comprises a switching circuit 20 which is shown in FIG. 2. The switching circuit 20 is enclosed within a conventional looking package 18 (FIG. 1) of the module 10. Essentially, when the switching circuit 20 is in a conductive state, current is conducted between the anode and cathode terminals 12 and 14; otherwise, no current flows between the terminals 12 and 14. The switching circuit 20 comprises two sub-circuits: a controlled transition circuit 22 and a low forward voltage conduction circuit 24. The two circuits 22 and 24 work in conjunction with each other to reduce interference signal generation and to reduce power consumption. The transition circuit 22 creates a smooth transition by slowly biasing a power transistor 26 into a current conductive state to eliminate high values of di/dt. The low forward voltage conduction circuit 24 then triggers a thyristor 28 into conduction and causes a second voltage transition and reduction across the terminals 12 and 14 to further reduce power consumption while in the conduction state. The transition circuit 22 is electrically connected to terminal 14 via a trigger signal developing device 30 and is directly connected to terminal 12. The conduction circuit 24 directly connects to the terminals 12 and 14 and to the transition circuit 22.

The transition circuit 22 is a DC circuit, and a conventional diode bridge 32 rectifies the AC power applied at terminals 12 and 14 so that DC current is available at nodes 34 and 36. The DC current is necessary for the proper operation of the transistor 26 since it only conducts current in one direction. Current from the diode bridge 32 passes through a resistor 38 and charges a capacitor 40. The capacitor 40 develops a voltage limited by a zener diode 42. The voltage across the capacitor 40 is available to bias the transition circuit 22 into operation.

The transition circuit 22 is biased into operation when a predetermined voltage trigger signal is applied to the gate terminal 16. Terminal 16 is comparable to the gate or trigger terminal of a conventional thyristor. The application of voltage to terminal 16 creates a voltage across a light emitting diode 44 of a typical optical coupler 46, which accepts the positive or negative polarity of conventional thyristor triggering pulses or steady-state DC triggering currents of either polarity. The light transmitted by the diode 44 causes a photo-responsive transistor 48 of the optical coupler 46 to commence conduction. The conduction of transistor 48 connects nodes 50 and 52. The voltage across the capacitor 40 is applied to the node 50. This voltage charges a capacitor 58. Generally, resistor 54 is of smaller value than resistor 56 in order that capacitor 58 charges relatively rapidly to satisfy di/dt requirements. The capacitor 58 discharges relatively slowly, on the order of a few milliseconds. The rapid charging is necessary to in order to begin the transition soon after the application of the predetermined trigger voltage to the gate terminal 16. The relatively slow discharge is sufficient to substantially discharge the capacitor 58 before the beginning of the next applied half-cycle.

After the capacitor 58 has been rapidly charged, the resulting voltage across the capacitor 58 then allows a capacitor 60 and resistor 62 to deliver a slowly increasing gate voltage bias signal to the power switching transistor 26. The slowly rising gate signal causes the switching transistor 26 to transition into full conduction relatively slowly over a relatively long period of time. The values of the capacitors 40, 58 and 60 and the resistors 54, 56 and 62 are chosen to define the rate of change in voltage applied to the gate of the switching transistor 26, and thus these values define the smooth switching conduction characteristics of the transition circuit 22.

Figure 3:
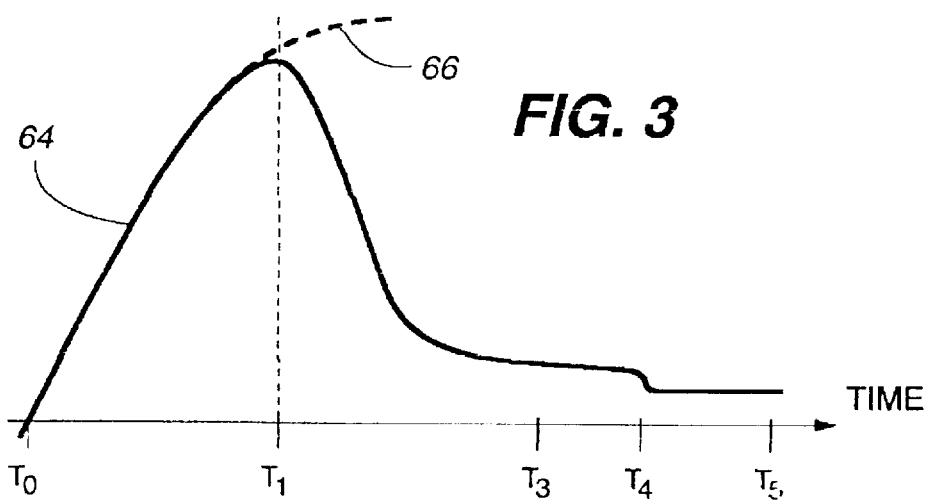
FIG. 3 is a waveform diagram showing an example of a voltage across the switching circuit shown in FIG. 2 upon switching into a conductive state while an AC voltage exists across the circuit.

An example of the smooth switching characteristic of the switching circuit 20 caused by the operation of the transition circuit 22 is shown in FIG. 3. The gradual, smooth slope or transition of a voltage 64 across the transition circuit 22 exists from time $T_1$ to time $T_3$. The transition time period from time $T_1$ to time $T_3$ may range, for example, from approximately 40 μs to 100 μs to avoid generation of interference signals.

At time $T_3$, the switching circuit 20 is conducting current and a majority of applied power 66 is applied to a load (not shown). However a notable circuit voltage across the switching circuit 20 exists at time $T_3$. As a result, since the power consumed by a circuit relates to the voltage across the circuit multiplied by the current conducted through the circuit, the switching circuit 20 is consuming significant amounts of power, particularly in high current conduction conditions. At time $T_4$ the switching circuit 20 decreases the voltage 64 across the terminals 12 and 14 by the operation of the conduction circuit 24. Lowering the voltage across the switching circuit 20 in this manner for the remainder of the conduction period significantly reduces overall power consumption and heat production of the switching circuit 20.

The low forward voltage conduction circuit 24 switches into conduction (at time $T_4$), which is a predetermined period of time after the transition circuit 22 becomes conductive to reduce the voltage across the switching circuit 20 to a lower level than is possible by the fully conductive power transistor 26 and diode bridge 32. Generally, once the conduction circuit 24 begins conducting current, the conduction circuit 24 essentially diverts current away from the transition circuit 22. This current diversion lowers the overall voltage drop across terminals 12 and 14 and thus reduces power consumption of the switching circuit 20 for the remainder of the conduction period.

The conduction circuit 24 is generally a thyristor-based switching circuit and comprises the thyristor 28 and a delay circuit 68. The thyristor 28 could be a triac, antiparallel SCR's, or other low forward voltage drop devices. The delay circuit 68 comprises the trigger signal developing device 30, such as a thyristor 74, a capacitor 70, and a resistor 72. The delay circuit 68 prevents the thyristor 28 from switching into conduction until after the expiration of a predetermined amount of time during which the power transistor 26 has become fully conductive. This time delay usually lasts longer than the time it takes for the power transistor 26 to become fully conductive. Otherwise, the thyristor 28 would switch into conduction when the forward voltage across the switching circuit 20 is higher than the lowest forward conduction voltage of the transition circuit 22, thus generating a slightly higher di/dt and higher interference signals than would otherwise occur.

The trigger signal developing device 30 develops a voltage as a result of the current flowing through the switching circuit 20. The voltage-current characteristics of a thyristor, having its gate connected to its anode (as shown), results in the development of a voltage at node 78 only when a significant current flows through the transition circuit 22. Thus, the voltage developed by the device 30 occurs at a time after the transition circuit 22 begins to conduct a substantial amount of current and is employed to develop a signal sufficient to trigger the thyristor 28 into conduction after the transition circuit reaches the fully conductive state. The capacitor 70 slowly charges in response to the voltage developed across the device 30, and its charging rate is defined by the values of the capacitor 70 and the resistor 72 and the magnitude of the voltage developed by the thyristor 74. The capacitor 70 eventually obtains a predetermined charge sufficient to trigger the thyristor 28 into conduction. Selecting the proper value for the capacitor 70 ensures that the thyristor 28 is not triggered until the transition circuit 22 has reached a fully or otherwise sufficiently conducting state.

Once the thyristor 28 is in full conduction, current is diverted from the transition circuit 22 causing the voltage across the terminals 12 and 14 to drop into the range of approximately 1.2 to 1.6 volts. The thyristor, creates a more rapid and instantaneous change in current within a relatively short amount of time. However, because the voltage across the switching circuit 20 is typically about 4–6 volts when the thyristor switches into conduction, a small amount of di/dt is created since the di is related to the overall change in voltage from 4–6 volts down to 1.2–1.6 volts. The reduced voltage across the terminals 12 and 14 is due to the current conduction through essentially one circuit element, the thyristor 28, which characteristically exhibits a lower forward voltage while fully conducting current than the fully-conductive bridge 54 and the power transistor 26. The resulting low forward voltage reduces the overall amount of power consumed by the switching circuit 20 during the remainder of conduction time as compared to the amount of power that would have been consumed had the transition circuit 22 remained as the primary current conduction path between the terminals 12 and 14.

In the particular embodiment of the delay circuit 68 shown in FIG. 2, the trigger signal developing device 30 is the thyristor 74. The gate of the thyristor 74 is connected to node 78. Once the transition circuit 22 begins to conduct a substantial amount of current, the thyristor 74 is triggered into conduction. When in conduction, the thyristor 74 remains on and has a consistent voltage across it until the voltage across it is reversed, i.e., when the AC voltage passes a zero crossing. The inherent impedance and operating voltage-current characteristics of the thyristor 74 generate a voltage across it which is sufficient to trigger the thyristor 28 into conduction. On the other hand, the thyristor 74 allows sufficient current to be conducted through the diode bridge 32 of the transition circuit 22 so as to charge the capacitor 40, without triggering the thyristor 28.

While a resistor could be used in place of the thyristor 74, its benefits would be more limited. For instance, the voltage developed across the resistor depends on the current conducted by the switching circuit 20 which, in turn, depends on the load connected to the circuit 20. Using the thyristor 74 makes the delay circuit less sensitive and more independent of the variations in load current than if a resistor was substituted. Also, other alternative trigger signal developing devices such as plural anti-parallel diodes or opposing zener diodes may be employed in the circuit 20 as substitutes for the thyristor 74.

Figure 4:
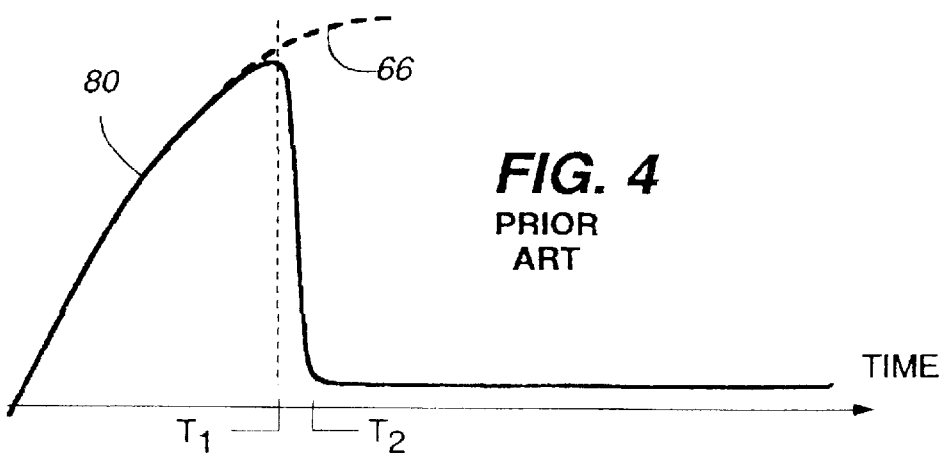
FIG. 4 is an exemplary waveform diagram depicting the voltage across a prior-art thyristor upon switching into conduction while an AC voltage exists across the thyristor.

The transition generated by the switching circuit 20, as shown in FIG. 3, is much smoother than the transition of a prior art thyristor shown in FIG. 4. Until the switching circuit 20 begins to conduct current at time $T_1$, the switching circuit 20 is in a non-conducting state. At time $T_1$ the switching circuit 20 switches into the current conducting state which is demonstrated by the thyristor circuit voltage waveform 64. Switching into a current conducting state causes the source-supplied, sine-wave AC voltage 66 to begin to be applied to the load (not shown) connected to the terminals 12 and 14, such that the voltage across the switching circuit 20 decreases between times $T_1$ and $T_3$ shown in FIG. 3. By time $T_5$, the switching circuit 20 is fully conductive and thus the majority of power supplied by the source is applied to the load. This operation may be repeated every half cycle to effectively control the total amount of power applied to the load. Variable control over the time when the switching circuit 20 switches into conduction ($T_1$), allows for variable amounts of delivered power to the load during each applied half-cycle.

FIG. 4 depicts an exemplary voltage waveform 80 across a common, prior art thyristor-based switching circuit. As can be seen from comparing the waveform 64 shown in FIG. 3 to the waveform 80 shown in FIG. 4, the switching characteristic of the prior-art, thyristor-based switching circuit appears almost instantaneous. The typical switching transition time from time $T_1$ to time $T_2$ shown in FIG. 4 lasts only a few $\mu$s compared to the much longer switching transition of waveform 64 between times $T_1$ and $T_3$ as shown in FIG. 3. Therefore, the switching circuit 20 has a much longer and more smooth switching transition period. Lengthening the switching transition period in this manner significantly reduces the conducted and radiated interference signals.

The switching transition time period from $T_1$ to $T_3$ shown in FIG. 3 is the "dt" used to determine the "di/dt" which directly relates to the magnitude of the interference signals. Therefore, it can be shown that by increasing dt, the value of di/dt decreases which likewise decreases the magnitude of any interference signals. By comparison, the switching transition time period $T_1$ to $T_2$ shown in FIG. 4 is much smaller than the switching transition time period shown in FIG. 3. The much smaller dt shown in FIG. 4 translates into higher di/dt values and likewise significantly higher amounts and magnitudes of generated interference signals.

Figure 5:
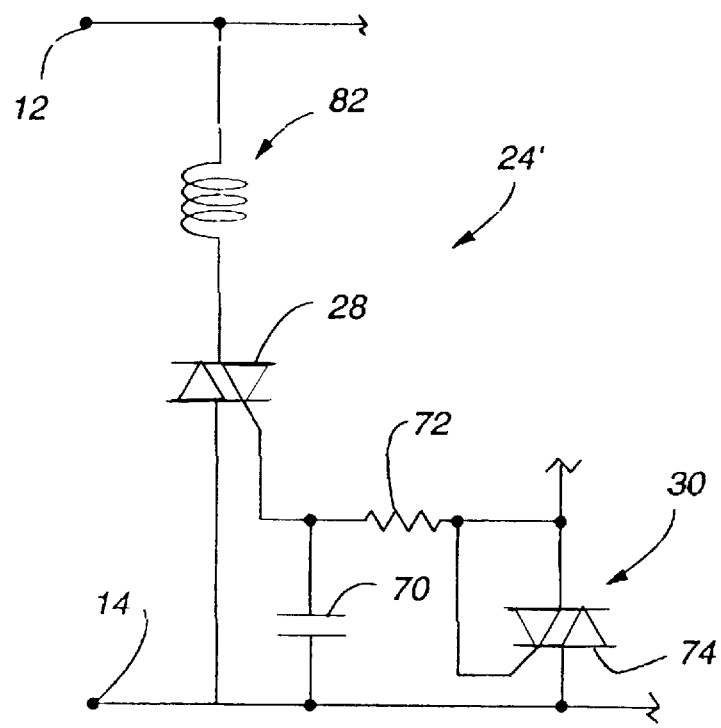
FIG. 5 is a schematic circuit diagram of an alternative portion of the switching circuit shown in FIG. 2.

An alternative 24' for the conduction circuit 24 shown in FIG. 2 is shown in FIG. 5. The alternative conduction circuit 24' includes an auxiliary attenuation element 82 connected in series with the thyristor 28 as shown in FIG. 5. In this particular embodiment, the auxiliary attenuation element is an inductor. The auxiliary attenuation inductor 82 may be used in situations where the switching circuit 20 is connected to loads that draw large amounts of current. When these higher current loads are utilized, the voltage change at time $T_4$ (FIG. 3) and the associated current change per change in time (di/dt) may be large enough to create unacceptable interference signals when the thyristor 28 switches. Therefore, the auxiliary attenuation inductor 82 may be used to slow the current change rate and thus decrease the di/dt associated with the circuit at time $T_4$. Lowering the di/dt value reduces the magnitude of any conducted interference signals.

Figure 6:
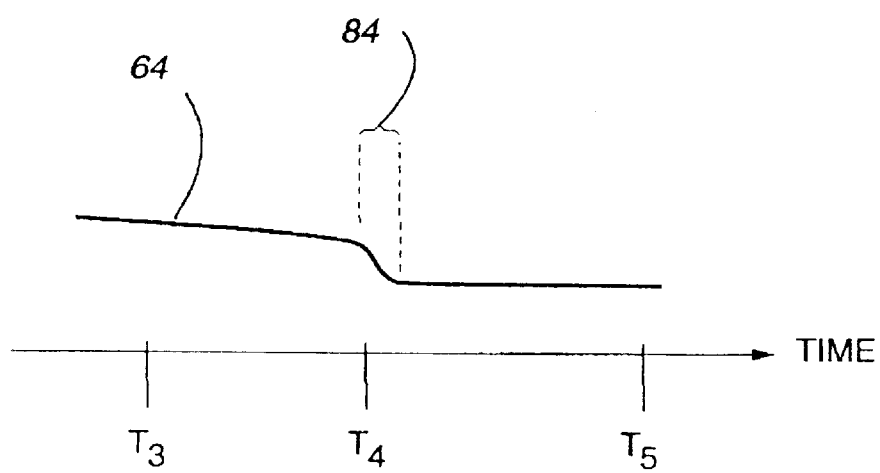
FIG. 6 is an enlarged portion of the waveform diagram shown in FIG. 3 showing the resulting voltage across the switching circuit shown in FIG. 2 when the alternative circuit portion shown in FIG. 5 switches into a conductive state.

The voltage characteristics of the switching circuit 20 which utilizes the auxiliary attenuation inductor 82 are shown in FIG. 6. As shown at 84, an appreciable amount of time is required to switch the conduction circuit 24' (FIG. 5) into full conduction, due to the current limiting effects of the inductor 82. By comparison, the conduction circuit 24 (FIG. 2) without the inductor 82 switches into conduction almost immediately as shown at time $T_4$ in FIG. 3. Slowing this transition time reduces the di/dt values during the transition and therefore reduces the magnitudes of the conducted interference signals.

Adding the auxiliary attenuation inductor 82 in this manner does not necessarily add prohibitive size or cost to the switching module 10 (FIG. 1). The increase in size does not become a limiting factor because the value of the inductor 82 can be exceedingly small, for example, 40 $\mu$H to 100 $\mu$H. The inductor 82 must only smooth the transition over a few volts (between 4–6 and 1.2–1.6 volts, for example), since the bulk of the current change has already occurred as a result of the switching effect from the transition circuit 22 (FIG. 2).

The switching circuit 20 has the interference-avoiding advantages of a smooth switching transistor-based circuit and the low power consuming advantages of a thyristor-based circuit. The smooth switching characteristics of the transition circuit 22 prevent the unwanted generation of large interference signals by reducing the di/dt. The low power consumption of the conduction circuit 24 effectively reduces the power consumed by the switching circuit 20. The reduced power consumption significantly reduces heat generation and reduces the need for additional heat dissipating elements, i.e., heat sinks. The absence of heat sinks coupled with the use of relatively small electrical elements reduces the overall size of the switching circuit 20. The ultimate size of a preferred embodiment of the switching circuit 20 is very small, allowing it to be formed into a conventional electronic circuit element package which can serve as a direct replacement for a conventional thyristor, as shown in FIG. 1.

A presently preferred embodiment of the present invention and many of its improvements have been described with a degree of particularity. This description is of a preferred example for implementing the invention, but the scope of the invention should not necessarily be limited by this description. The scope of the present invention is defined by the following claims.

The invention claimed is:

1. A switching circuit module having a relatively smooth turn-on conduction transition characteristic and a relatively low power consumption and which is adapted to replace a conventional thyristor, the switching circuit module comprising:

a gate terminal;

an anode terminal and a cathode terminal between which current flows when the switching circuit is in conduction;

a controlled transition circuit electrically connected to conduct current between the anode and cathode terminals when in a fully conductive state and not to conduct current between the anode and cathode terminals when in a non-conductive state, the controlled transition circuit transitioning from the non-conductive state to the fully conductive state over a first predetermined amount of time when a predetermined voltage is applied to the gate terminal, the controlled transition circuit creating a first predetermined voltage across the terminals when in the fully conductive state; and a low forward voltage conduction circuit electrically connected to conduct current between the anode and cathode terminals when in a conductive state and to divert current to the controlled transition circuit when in a non-conductive state, the low forward voltage conduction circuit creating a second predetermined voltage across the anode and cathode terminals when in the conductive state which is substantially less than the first predetermined voltage.

2. A switching circuit module as defined in claim 1 wherein the low forward voltage conduction circuit further comprises:

a delay circuit which operatively initiates a transition from the non-conductive state to the conductive state of the low forward voltage conduction circuit after the expiration of the first predetermined amount of time commencing after the transition circuit enters the conductive state.

3. A switching circuit module as defined in claim 2 wherein:

the delay circuit operatively limits the low forward voltage conduction circuit from conducting current between the anode and cathode terminals until after the controlled transition circuit reaches the fully conductive state.

4. A switching circuit module as defined in claim 1 wherein the controlled transition circuit further comprises a power transistor and a biasing circuit which supplies an increasing bias signal to the transistor over the duration of the first predetermined amount of time.

5. A switching circuit module as defined in claim 4 wherein the bias signal is initiated from a signal on the gate terminal.

6. A switching circuit module as defined in claim 1 wherein the low forward voltage conduction circuit comprises a thyristor.

7. A switching circuit module as defined in claim 6 wherein the low forward voltage conduction circuit further comprises a current change rate attenuating device connected to the thyristor to limit the change of current per change in time conducted by the thyristor.

8. A switching circuit module as defined in claim 7 wherein the current change rate attenuating device comprises an inductor.

9. A switching circuit module as defined in claim 8 which is incorporated in a standard electrical device package.

10. A switching circuit module as defined in claim 1 wherein the low forward voltage conduction circuit further comprises a trigger signal delivery circuit connected to the thyristor to trigger the thyristor into conduction at the expiration of the first predetermined amount of time.

11. A switching circuit module as defined in claim 10 wherein the trigger signal delivery circuit further includes a trigger signal developing device connected to the conduction circuit to develop a trigger signal in response to the conduction of current by the transition circuit.

12. A switching circuit module as defined in claim 11 wherein the trigger signal developing device comprises a second thyristor in addition to the thyristor first aforesaid.

13. A switching circuit module as defined in claim 11 wherein the trigger signal developing device comprises a plurality of diodes connected in an anti-parallel relationship.

14. A switching circuit module as defined in claim 13 wherein the diodes comprise Zener diodes.

15. A switching circuit module as defined in claim 11 wherein the trigger signal developing device comprises an electrical device having a voltage-current characteristic which develops a voltage sufficient to trigger the thyristor upon conducting a predetermined amount of current delivered from the transition circuit after the transition circuit enters the conductive state.

16. A switching circuit module as defined in claim 15 wherein:
   the trigger signal developing circuit further includes a delay circuit; and
   the voltage developed by the trigger signal developing device is applied to the delay circuit prior to triggering the thyristor into conduction.

17. A switching circuit module as defined in claim 11 wherein the trigger signal developing device comprises an electrical device having an electrical characteristic which develops a trigger signal as a result of the transition circuit conducting current upon entering the conductive state.

18. A switching circuit module as defined in claim 17 wherein:
   the trigger signal developing circuit further includes a delay circuit; and
   the trigger signal developed by the electrical device is applied to the delay circuit to delay triggering the thyristor into conduction.

* * * * *